United States Patent
Jaakkola et al.

(10) Patent No.: US 9,991,869 B2
(45) Date of Patent: Jun. 5, 2018

(54) TEMPERATURE COMPENSATED COMPOUND RESONATOR

(71) Applicant: Teknologian tutkimuskeskus VTT Oy, Espoo (FI)

(72) Inventors: Antti Jaakkola, Espoo (FI); Panu Pekko, Espoo (FI); Mika Prunnila, Espoo (FI); Tuomas Pensala, Espoo (FI)

(73) Assignee: Teknologian tutkimuskeskus VTT Oy, Espoo (FI)

(*) Notice: Subject to any disclaimer, the term of this patent is extended or adjusted under 35 U.S.C. 154(b) by 291 days.

(21) Appl. No.: 14/874,514

(22) Filed: Oct. 5, 2015

(65) Prior Publication Data
US 2016/0099702 A1  Apr. 7, 2016

(30) Foreign Application Priority Data

Oct. 3, 2014 (FI) .................................... 20145870

(51) Int. Cl.
*H03H 3/013* (2006.01)
*H03H 9/02* (2006.01)
(Continued)

(52) U.S. Cl.
CPC ...... *H03H 9/02448* (2013.01); *H03H 9/0538* (2013.01); *H03H 9/2405* (2013.01);
(Continued)

(58) Field of Classification Search
CPC .......... H03H 9/02244; H03H 9/02448; H03H 9/02433; H03H 9/0571; H03H 9/2405;
(Continued)

(56) References Cited

U.S. PATENT DOCUMENTS 7,362,197 B2 * 4/2008 Lutz ..................... B81B 3/0072
333/186
7,591,201 B1 * 9/2009 Bernstein ............. H03H 3/0076
74/2
(Continued)

FOREIGN PATENT DOCUMENTS

WO  WO 2008043727 A1 *  4/2008  ............... H03H 3/04
WO  WO 2012110708 A1 *  8/2012  ........... H03H 3/0076

OTHER PUBLICATIONS

Ho, G. K. et al. "Micromechanical IBARs: Modeling and Process Compensation", Journal of Microelectromechanical Systems, Jun. 2010, vol. 19, Issue 3, pp. 516-525, ISSN: 1057-7157, doi: 10.1109/JMEMS.2009.2030076, XP011308240.
(Continued)

*Primary Examiner* — Edgardo San Martin
(74) *Attorney, Agent, or Firm* — Seppo Laine Oy

(57) ABSTRACT

The invention concerns microelectromechanical resonators. In particular, the invention provides a resonator comprising a support structure, a doped semiconductor resonator suspended to the support structure by at least one anchor, and actuator for exciting resonance into the resonator. According to the invention, the resonator comprises a base portion and at least one protrusion extending outward from the base portion and is excitable by said actuator into a compound resonance mode having temperature coefficient of frequency (TCF) characteristics, which are contributed by both the base portion and the at least one protrusion. The invention enables simple resonators, which are very well temperature compensated over a wide temperature range.

18 Claims, 19 Drawing Sheets

(51) Int. Cl.
*H03H 9/05* (2006.01)
*H03H 9/24* (2006.01)
*H03H 3/007* (2006.01)

(52) U.S. Cl.
CPC ............ *H03H 2009/02527* (2013.01); *H03H 2009/241* (2013.01); *H03H 2009/2442* (2013.01)

(58) Field of Classification Search
CPC ... H03H 2009/02527; H03H 2009/241; H03H 2009/2442
See application file for complete search history.

(56) References Cited

U.S. PATENT DOCUMENTS

| | | | | |
|---|---|---|---|---|
| 8,558,643 | B2* | 10/2013 | Prunnila | B81B 3/0072 257/28 |
| 9,071,226 | B2* | 6/2015 | Jaakkola | H03H 9/02448 |
| 9,559,660 | B2* | 1/2017 | Pensala | H03H 3/0076 |
| 9,695,036 | B1* | 7/2017 | Berger | B81B 3/0024 |
| 9,712,128 | B2* | 7/2017 | Doll | H03H 9/17 |
| 9,742,373 | B2* | 8/2017 | Raieszadeh | H01L 23/34 |
| 2007/0024158 | A1* | 2/2007 | Bourgeois | H03H 9/02259 310/321 |
| 2009/0307884 | A1* | 12/2009 | Duwel | H03H 3/02 29/25.35 |
| 2010/0127596 | A1* | 5/2010 | Ayazi | H03H 3/0077 310/300 |
| 2011/0204999 | A1* | 8/2011 | Phan Le | H03H 9/02259 333/200 |
| 2011/0210801 | A1* | 9/2011 | Rottenberg | G01K 7/32 331/156 |
| 2012/0286903 | A1* | 11/2012 | Prunnila | B81B 3/0072 333/234 |
| 2013/0187724 | A1* | 7/2013 | Jaakkola | H03H 9/02448 331/158 |
| 2014/0077898 | A1* | 3/2014 | Pensala | H03H 3/0076 333/187 |
| 2014/0313866 | A1* | 10/2014 | Hessler | H03H 3/0076 368/202 |
| 2016/0099703 | A1* | 4/2016 | Jaakkola | H03H 9/02448 310/300 |
| 2016/0099704 | A1* | 4/2016 | Jaakkola | H01L 41/18 310/321 |

OTHER PUBLICATIONS

Ho, G. K. et al. "Micromechanical IBARs: tunable high-Q resonators for temperature-compensated reference oscillators", Journal of Microelectromechanical Systems, 2010, vol. 19 No. 3.

Thakar V et al. "Optimization of tether geometry to achieve low anchor loss in Lamé-mode resonators", 2013 Joint European Frequency and TIme Forum & International Frequency Control Symposium (EFTF/IFC), Jul. 21-25, 2013.

Agache et al.: "High Q factor plate resonators for ultrasensitive mass sensing applications", Transducers 2009, Denver (CO) USA, Jun. 21-25, 2009, pp. 1630-1633.

Hajjam et al.: "Doping-induced temperature compensation of thermally actuated high-frequency silicon micromechanical resonators", Journal of Microelectromechanical Systems, vol. 21, No. 3, Jun. 3, 2012, pp. 681-687.

Hajjam et al.: "Temperature compensated single-drive electromechanical oscillators", MEMS 2011, Cancun, Mexico, Jan. 23-27, 2001, pp. 801-804.

* cited by examiner square: |nodalFOM|< 0.05
dot: -3.5 < dTCF < - 2.5 square: |nodalFOM|< 0.05
dot: -2.5 < dTCF < - 1.5 square: |nodalFOM| < 0.05
dot: -1.5 < dTCF < - 0.5

Fig. 6G

TEMPERATURE COMPENSATED COMPOUND RESONATOR

FIELD OF THE INVENTION

The invention relates to microelectromechanical resonators. In particular, the invention relates to adjusting temperature coefficient of frequency (TCF) of resonators.

BACKGROUND OF THE INVENTION

Widely used quartz crystal based resonators can potentially be replaced by micromechanical, typically silicon-based, resonators in many applications. Silicon resonators can be made smaller than quartz resonators and there are a plurality standard manufacturing methods for silicon resonators. However, a problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/C. This causes the resonance frequency to fluctuate due to changes in ambient temperature.

As concerns the TCF, both the linear, i.e. $1^{st}$ order, and $2^{nd}$ order behaviors are important in practice, since the first one represents local change of frequency on temperature change (ideally zero) and the second one represents the width of the low-drift temperature range. If the first order term is zeroed, the frequency drift comes from the second order term alone, there being a certain "turnover temperature", where the TCF achieves its absolute minimum value. The $2^{nd}$ order TCF is herein also denoted $TCF_2$ in contrast to 1st order coefficient $TCF_1$ (linear TCF). AT-cut quartz crystals have near-zero low $TCF_1$ and $TCF_2$ at 25° C., their total frequency drift typically being within +−10 ppm over a wide temperature range of −40° C. . . . +85° C. The temperature performance of silicon resonators is considerably worse at the present.

One promising approach to remove or mitigate the problem of temperature drift is extremely heavy doping of silicon. The effect of homogeneous n-type doping of concentration greater than $10^{19}$ cm$^{-3}$ on bulk acoustic wave (BAW) resonator behavior has been discussed for example in WO 2012/110708. The document discusses that $TCF_1$ of a "pure" $c_{11}$-$c_{12}$ mode ($c_{11}$, $c_{12}$ and $c_{44}$ are elastic terms of the Young modulus of silicon) stays well above zero, and thus the frequency is still very dependent on temperature. However, other BAW resonance modes such as a square extensional (SE) or width extensional (WE) mode, have such dependence on elastic parameters $c_{11}$, $c_{12}$ (and $c_{44}$), that the linear TCF can be made zero by correct selection of their in-plane geometry aspect ratio. It has also been demonstrated that n-type doping level (doping agent phosphorus) of $11*10^{19}$ cm$^{-3}$ and more can be produced in practice.

Another approach is to form an effective material structure with superimposed layers having different doping levels or crystal orientations, as discussed in U.S. Pat. No. 8,558,643. The structure forms a superlattice capable of carrying a resonance mode whose TCF is considerably less that of an undoped or homogeneously doped corresponding silicon element. Such structure can be also be used to decrease the $2^{nd}$ order TCF to some extent so that temperature drift of less than 50 ppm over a 100° C. range is achieved.

The abovementioned documents cite also other documents utilizing silicon doping and briefly discusses also other methods to deal with the temperature drift problem.

The temperature behavior or a resonator is not only dependent on the doping concentration, but also on its geometry, crystal orientation and resonance mode excited therein, to mention some important factors. In addition, factors that need to be taken into account are the Q-value of the resonator, in which anchoring of the resonator plays an important role, and ability to manufacture the resonator design in practice. Low TCF and high Q-value may be contradictory design objectives using known resonator designs, since they are generally achieved with different geometrical layouts, for example.

At the present, there are only few practically feasible low-TCF silicon resonator designs available, some of which are disclosed in WO 2012/110708 and U.S. Pat. No. 8,558,643. However, there is a need for new and improved practically feasible designs, which allow for better control of TCF characteristics and simultaneously high Q-value. A simple manufacturing process is also desirable.

SUMMARY OF THE INVENTION

It is an aim of the invention to provide a novel resonator design whose TCF characteristics are adjustable to meet particular needs.

In particular, it is an aim to provide a resonator design which can be efficiently temperature compensated and whose turnover temperature can be conveniently set. It is also an aim to provide a resonator design by which the width of the low drift temperature range, i.e. can be increased.

A specific aim of the invention is to provide a resonator meeting one or all of the abovementioned aims and still having a high quality factor.

The invention is based on the observation that the TCF characteristics of a doped plate resonator with a specific characteristic resonance mode can be provided with protrusions affect the TCF of the whole resonator in a desired way, such as minimizing the $1^{st}$ order TCF, and potentially also $2^{nd}$ order TCF and higher order terms. The compound resonator formed by the plate and the protrusions resonate in a compound mode that allows for this kind of change in the TCF characteristics compared with those of a plain plate resonator. The compound mode can be thought as being formed of a first resonance in the plate and a second resonance different from the first resonance and having different TCF characteristics in the protrusions, there however being coupling between the plate and the protrusions. To achieve additional aims of the invention, of importance is also the fact that the plate and the extensions can be designed such that there still exist nodal points at the perimeter of the resonator the resonator that can serve as anchoring points to maintain high Q-value for the resonator.

The invention thus provides a microelecromechanical resonator comprising a support structure, a doped semiconductor resonator suspended to the support structure by at least one anchor element, and an actuator for exciting resonance into the resonator. According to the invention, the resonator comprises a base portion and at least one protrusion extending outward from the perimeter of the base portion. The resonator is excitable by the actuator into a compound resonance mode having TCF characteristics, which are contributed by both the base portion and the at least one protrusion, which take part in the compound resonance.

In particular, the compound resonator formed this way is excitable into a compound resonance mode comprising different kinds of resonances in the base portion and in the protrusion(s), for example a BAW resonance in the base portion and a flexural resonance in the protrusion(s).

In particular, the TCFs of the base portion and protrusions can be of opposite sign, whereby the overall TCF can be minimized using base portion geometry that allows low-loss anchoring. In this embodiment, the resonator thus comprises an overcompensated main portion and undercompensated protrusion(s), or vice versa.

More specifically, the invention is characterized by what is stated in the independent claim.

Considerable advantages are achieved by means of the invention. In particular, the invention enables adjustment of the TCF characteristics of silicon resonators using carefully selected protrusions without having to compromise the quality factor of the resonator.

The invention solves the TCF and quality factor problem for example by modifying the geometry of a BAW mode resonator, such as a WE, LE or Lamé mode resonator, in such a way that simultaneous nodal anchoring and close to zero linear TCF is achieved. Nodal anchoring, i.e., positioning the anchoring elements to the resonator element at nodal point of the resonance mode. Anchoring at nodal point(s) is a prerequisite for high quality factor operation. In practice, for typical manufacturing processes, this means that the nodal point has to be at the perimeter of the resonator, which is possible using the present design.

As concerns practical applications of the present invention, the resonator can be used as a very low power reference oscillator, because active temperature compensation is not needed.

The invention is also realizable using n-type doping concentration provably achievable in practice. Compared with superlattice structures with different material properties in different layers stacked on top of each other, the present resonator element can be manufactured as a monolithic one-layer element, whereby its manufacturing is straightforward. Also the required dopant concentrations are smaller than what would be needed for a superlattice realization. One can also avoid complex active temperature compensation circuits around the resonator, since the resonator is inherently designed to meet the required frequency stability level.

Dependent claims are directed to selected preferred embodiments.

Although there is strong acoustic coupling between the base portion and the protrusion(s), the base portion can be thought as comprising a first resonance mode having first TCF characteristics, and the protrusion comprises a second resonance mode different from the first resonance mode having second TCF characteristics. The second TCF characteristics are generally different from the first TCF characteristics, whereby the co-operative action of the base portion and protrusions element(s) determine the overall temperature performance for the resonator oscillating is the compound mode. The protrusions preferably extend laterally from the base portion.

In one preferred embodiment, the first resonance mode is a bulk acoustic wave (BAW) mode and the second resonance mode is a flexural mode.

In one preferred embodiment, the first and second resonance modes have different resonance frequencies from each other.

According to one embodiment, the base portion comprises a rectangular plate having an aspect ratio higher than one. A WE mode or LE mode can be exited to such plate and with suitable side lengths, there exists two nodal points on sides of the plate which serve as optimal anchoring points.

According to one embodiment the main potion is a WE mode resonator having an aspect ratio resulting in nodal points in the middle of both longitudinal ends thereof. The anchoring elements join the main portion at these points. Further, the protrusions comprise flexural beam-shaped extensions to adjust the TCF of the resonator. In this design, there are enough degrees of freedom (width, length, location on the horizontal edge) for the flexural extensions so that there exist solutions at which a desired change in TCF (within predefined limits) can be achieved, while at the same time preserving the nodal points. The whole resonator is preferably doped to a doping level of at least $2.3*10^{19}$ cm$^{-3}$. At these doping levels, zero $TCF_1$ is achievable. Preferably, the design also zeroes $TCF_2$ at the same point where $TCF_1$ is zeroed.

According to an alternative embodiment, the main portion is a LE mode resonator with anchoring points on opposite longitudinal sides thereof, the protrusions again comprising flexural beams. This embodiment is beneficial, because in some configurations $TCF_1$ of a WE mode resonator drops too low at the doping level where $TCF_2$ is zeroed. Thus, there may not be geometry on the WE-SE branch for which $TCF_1=TCF_2=0$ could be satisfied (TCF<0 for all aspect ratios). Then, a geometry with $TCF_1=TCF_2=0$ may be found on the Lamé-LE mode branch. It may also be beneficial to decrease the linear TCF of the modes on this branch by slightly modifying the geometry.

When both $TCF_1$ and $TCF_2$ are zero the total frequency drift is very small. In particular, the total frequency drift of the resonator according to embodiments of the invention can be within +−10 ppm over a range of at least 50° C., in particular 125° C., preferably over a range of T= −40° C. . . . +85° C. (so-called industrial range), which roughly corresponds to the temperature performance level of a quartz crystal.

According to one embodiment, the number of protrusions is four or more, which easily allows placing of the elements around the main plate symmetrically and therefore total lateral symmetry for the resonator.

As already mentioned above, according to one embodiment the at least one protrusion comprises a flexural beam or a plurality of beams excitable into a flexural mode, which generally has different TCF characteristics than a WE and LE modes.

In one embodiment, the beams have a crystal orientation with respect to longitudinal axis of the beam different from the crystal orientation of the base portion with respect to a main axis of the base portion. The angle of each beam with respect to a main axis of the base portion is preferably 20-70°, 45° corresponding the to [110] crystal direction.

In an alternative embodiment, the protrusions comprise a plurality of flexural beams each protruding from the base portion in the direction of one of the main axes of the base portion. Although in this case the crystal orientation of the beams is the same as in the main portion, the flexural mode and chosen geometry result in the protrusions having different TCF characteristics than the main portion.

In one embodiment, the base portion of the resonator element is a rectangular plate having an aspect ratio of about 1:1.5, 1:2.7, 1:4.3, 1:5.5, 1:7.0, 1:8.7, or any other aspect ratio providing nodal points at perimeter thereof, and with one main axis directed along the [100] crystal direction of the semiconductor material (with +/−5° precision). The protrusions are directed essentially along the [110] or [100] crystal direction of the semiconductor material (again with +/−5° precision), depending on the desired effect of the protrusion to the temperature behavior of the resonator.

The anchor elements preferably comprise narrow bridges that suspend the resonator element and typically also at least part of actuation means to the surrounding structure. The number of anchor elements is preferably at least two and they are preferably spanned between the support structure and two or more nodal points of the first BAW resonance mode taking place in the main portion of the resonator.

It is also possible to use a square-shaped main plate resonating in the Lamé mode. Also in this case, flexural protrusions alter the total TCF characteristics of the resonator. Nodal points at corners of the plate are characteristic to a Lamé mode and can be preserved even with the protrusions, whereby anchoring can be arranged at the four corners of the plate.

In a preferred embodiment, the resonator element comprises a monolithic silicon crystal. The silicon matrix is preferably doped with an n-type doping agent to an average doping concentration of at least $2.3*10^{19}$ cm$^{-3}$, in particular $2.3 \ldots 20*10^{19}$ cm$^{-3}$. As concerns the preferred WE-flexural and LE/Lamé-flexural compound resonators, the most beneficial doping range is $7-20*10^{19}$ cm$^{-3}$, which allows for not only full $1^{st}$ order temperature compensation, but also full $2^{nd}$ order compensation simultaneously. The doping ranges given above take into account that in practical designs for example actuators, such as piezoelectric actuators typically decrease overall $TCF_1$ and $TCF_2$, whereby the silicon crystal needs to be "overdoped" (compared with theoretical estimates neglecting e.g. actuators), so that $TCF_1$ and $TCF_2$ are above zero with high enough margin.

The doping concentration may be essentially homogeneous over the resonator element, but homogeneity in particular in the depth direction of the silicon wafer is not absolutely necessary. It is however preferred that the average doping concentrations remain in the abovementioned ranges.

It should be noted that the main portion and protrusions according to the invention are acoustically coupled and therefore a compound resonance mode affected by the properties of both these entities is formed into the resonator. However, the compound mode is such that different resonance modes dominate each of the entities, i.e. mostly determine their mechanical movement and TCF characteristics. These sub-modes in the compound mode resemble ideal (pure) modes that would excite in correspondingly shaped parts if they were acoustically isolated from other parts. In practice there may be deviation from the ideal behavior in particular at the intersecting zones of the different parts. The terminology "compound resonance mode essentially comprising a first (second) resonance mode in a base portion (in a protrusion)" covers such non-ideal resonances. A skilled person is able to distinguish between different modes, such as BAW modes (in particular WE, LE and Lamé modes) and flexural modes even if not present in pure form.

The term "TCF characteristics" means the shape of the frequency-vs-temperature curve of the resonator, and in particular the combination of $1^{st}$ order and $2^{nd}$ order change of the resonance frequency of the resonator with temperature. The TCF characteristics of the present resonator is contributed by the base portion and the protrusions, which means that its TCF characteristics are different from the TCF characteristics of any of these parts in isolation from other parts. Indeed, the term TCF characteristics, when referring to only a part of the compound resonator, means the TCF characteristics of a similar part if it was rigidly fixed to an imaginary line that connects the part to other parts.

The term "different TCF characteristics" (between two acoustically coupled parts of the resonator) means that either the $1^{st}$ order, the $2^{nd}$ order behaviors or both are different (for the two parts). Formulated more mathematically, the definition of $TCF_1$ and $TCF_2$ is obtained from a power series representation of temperature dependent frequency f of a resonator:

$$f(T)=f_0[1+TCF_1 \times \Delta T+TCF_2 \times \Delta T^2],$$

where $\Delta T=T-T_0$ is the temperature differential, $f_0$ is the frequency at the reference temperature $T_0$ (for further details see e.g. A. K. Samarao at al, *"Passive TCF compensation in high q silicon micromechanical resonators,"* in *IEEE International Conference on Micro Electro Mechanical Systems* (*MEMS* 2010), Hong Kong, January 2010, pp. 116-119). If not otherwise mentioned, herein $T_0=25°$ C. is used.

In particular, the invention covers the situation where the TCFs of the base portion and the protrusions investigated separately are of opposite sign for at least one temperature region, which allows for minimizing the compound $1^{st}$ order TCF component (at that temperature region), tuning the turnover temperature point of the resonator, and also minimizing the overall $2^{nd}$ order TCF component, i.e. providing a large stable operating temperature range for the resonator, optionally still maintaining the possibility of anchoring at nodal (including quasinodal) points of the resonator.

The "base portion" is typically a rectangular, square or disc-shaped (circular or oval) plate.

"Protrusion" means a feature extending from the base portion, in particular in the lateral plane, and being capable of resonating therewith. Usually the protrusion has a smaller lateral area than the base portion, typically at maximum 30% thereof. In accordance with one embodiment of the invention, a protrusion is a feature that is capable of being excited into flexural resonance while the main portion contains a BAW resonance to form a BAW-flexural compound resonance mode.

"Lateral" herein means directions in the plane of the resonator, i.e., typically co-planar with the wafer the resonator device is manufactured to.

"Main axis" of an element means an axis of elongation and/or symmetry of an element. For example main axes of a rectangle or square are oriented in the directions of the sides of the rectangle or square and coincide with its symmetry axis. The main axis of a beam is along the elongated direction of the beam.

The term "nodal point" of a resonance mode covers also points which as known in the art as quasinodal points.

Next, selected embodiments of the invention and advantages thereof are discussed in more detail with reference to the attached drawings.

BRIEF DESCRIPTION OF THE DRAWINGS

FIG. 6F-6K show simulation results for WE-flexural mode compound resonator geometries to show that optimal nodal anchoring and efficient temperature compensation are possible simultaneously.

FIG. 8B comprises extrapolated portion (straight dashed line) for $b_{11\text{-}12}(n)$ used for calculation of the results of FIG. 8C.

DETAILED DESCRIPTION OF EMBODIMENTS

Compound resonators including a width-extensional base portion, a length-extensional or Lame-mode base portion combined with a plurality of flexural beams laterally extending from the base portions as the protrusions are discussed below in more detail as preferred embodiments. Also some variations are discussed by way of example. It should be noted that designs according to the invention are many and may deviate from the illustrated ones.

Compound WE-flexural Mode Resonator

As one principal embodiment, the invention can be applied for resonator plates operating in the width extensional (WE)/length extensional (LE) modal branch.

Figure 1A:
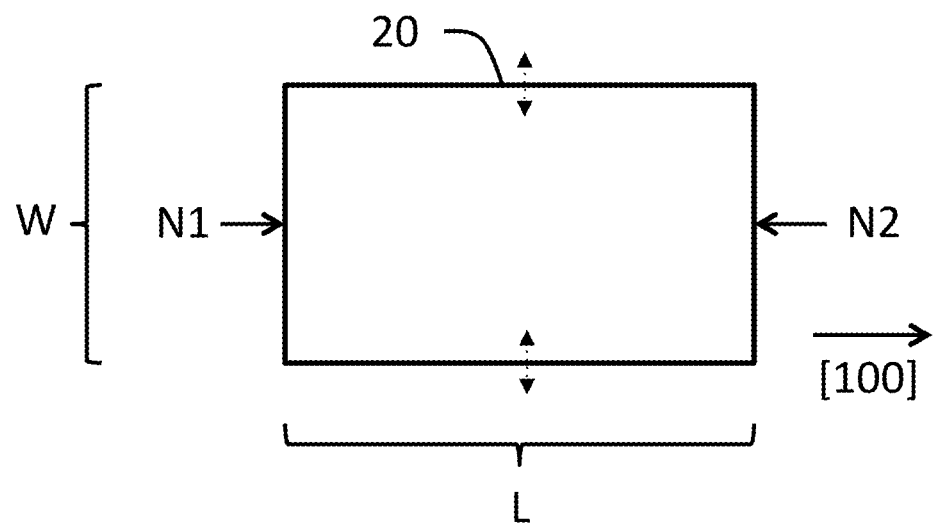
FIG. 1A shows a rectangular plate resonator in WE mode.

FIG. 1A shows a rectangular plate resonator element 20 having a width W and length L. The length direction is oriented along the [100] crystal direction of the crystal matrix. As concerns low-loss anchoring of the resonator element, for a resonator like this, optimal aspect ratios (expressed as W:L) are 1:1.5, 1:2.7, 1:4.3, 1:5.5, 1:7.0, 1:8.7, ... (with 5% accuracy). With these aspect ratios, if a pure WE mode is excited to the element 20, there are two nodal points N1 and N2 at the perimeter, in more detail opposite longitudinal ends, of the element 20. These points N1 and N2 serve as ideal (non-moving) anchoring points for the resonator and provide a high quality factor for the resonator. On the other hand, as discussed above, there is likely to be a single doping level and single aspect ratio for a WE resonator which yields second order compensation, i.e., $TCF_1=TCF_2=0$. This aspect ratio is, however, generally different from the aspect ratio optimal for anchoring, i.e., does not yield nodal points at the resonator perimeter. Additional considerations on this aspect are presented later in this document.

According to one embodiment, to make a WE resonator with $TCF_1=TCF_2=0$ in combination with nodal anchoring, there are provided flexural protrusions to the rectangular main portion of the resonator element 20. The flexural protrusions are part of the same monolithic structure as the main portion and are capable of resonating in a flexural mode having different TCF characteristics than the rectangular main portion 20 in the WE mode. Some such designs are illustrated in FIGS. 1B-1E and described in more detail below. It should be noted that the main portion and protrusions are separated by lines in the drawings for clarity reasons, but in practice typically form a monolithic unitary structure.

Figure 1B:
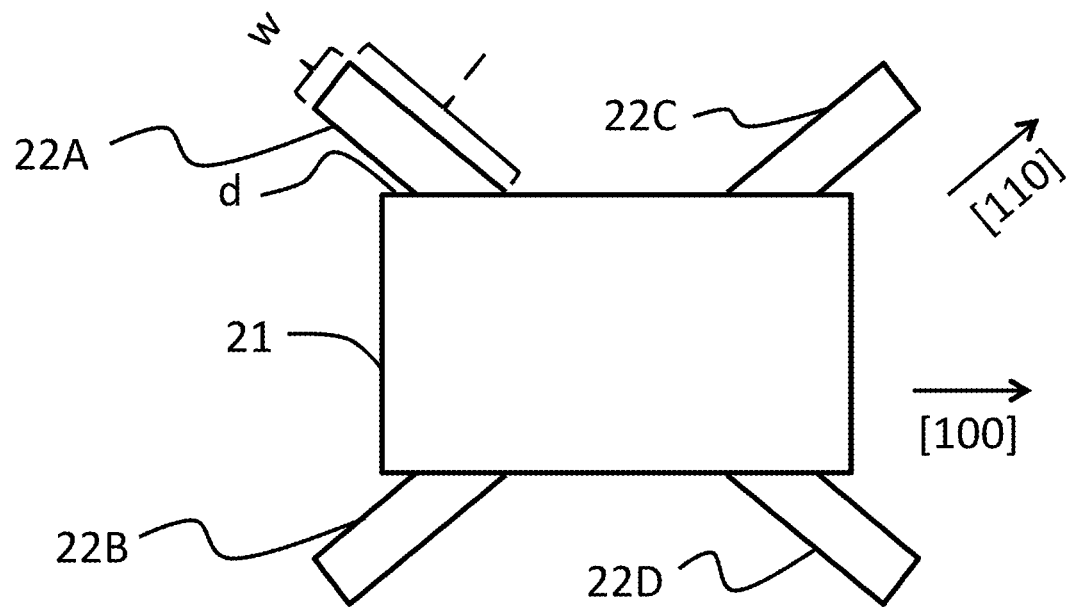
FIGS. 1B-1I show compound resonators according to different embodiments of the invention.

According to the embodiment illustrates in FIG. 1B, there are provided four symmetrical flexural beams 22A-D directed in the lateral plane into [110] direction from the perimeter of a rectangular main portion 21 away from each other (outward configuration). Each of the beams has a length l, width w and is placed at a longitudinal side of the main portion at a distance d from a corner thereof. At certain doping concentration and parameter values L, W, l, w and d, the beams 22A-D resonate in a flexural mode having a TCF of opposite sign compared with the main portion 21, rendering the total TCF of the compound resonator close to zero. Anchoring (not shown) is preferably arranged at longitudinal ends of the main portion 21, as shown in FIG. 1A.

Figure 1C:
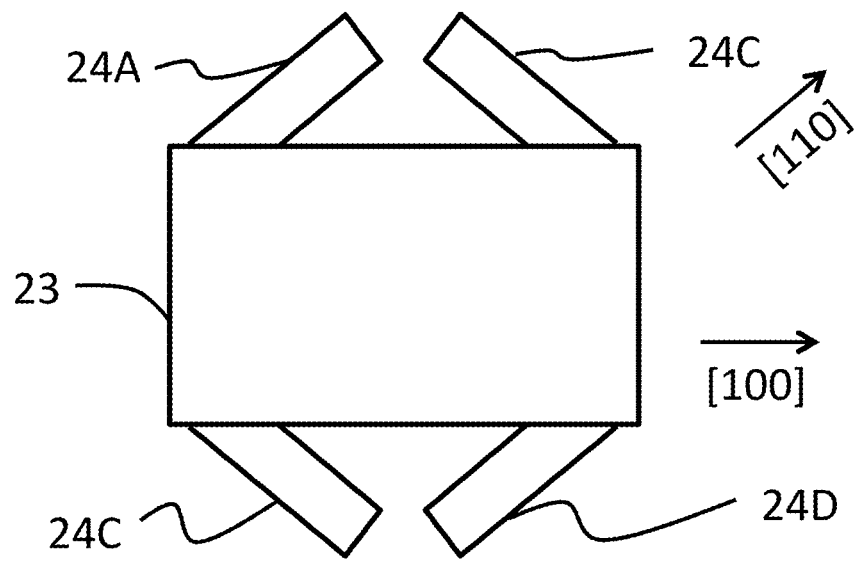

FIG. 1C represents an alternative configuration, where the resonator comprises base portion 23 and again four symmetrically placed flexural beams 24A-D directed essentially into [110] direction from the perimeter the main portion 23, but this time pairwise towards each other (inward configuration). Anchoring (not shown) is preferably arranged at longitudinal ends of the main portion 23. The effect of the flexural beams 24A-D in this inward configuration is essentially the same as in the outward configuration, but the space required by the resonator on the semiconductor wafer is smaller.

It should be noted that the beams 22A-D or 24A-D need not be oriented exactly into the [110] direction, but may be oriented for example in direction 20 . . . 70°, in particular 30 . . . 60°, preferably 40 . . . 50°, with respect to the longitudinal main axis o the plate.

It should also be noted that the number of beams may be different from four. It is, however preferred to preserve a configuration, which is symmetrical with respect to both main axes of the base portion to maintain the WE mode of the base portion as pure as possible. In particular, there may be provided more than two beams, such as 4 smaller beams, on each longitudinal side of the base portion.

Moreover, it should be noted that the beams need not be trapezoidal, as shown in the Figures, but may take another form, as long as their linear TCF has an opposite sign compared with the base portion and they are capable of resonating in a flexural mode. FIGS. 1F and 1G show two examples of such variations, the former one comprising tapering beams 30 extending from a rectangular base plate 29 and the latter one comprising widening beams 32 extending from a rectangular base plate 30.

Finally, it should be noted that the whole crystal plane may be different form the 100 crystal plane used in the detailed examples of this document. For example, and in some cases it may be desirable to rotate the whole structure around its normal axis in order to meet the design needs, since rotation affects the TCF characteristics of the resonator. In addition, modes of similar nature as herein discussed may exist on 110 wafers. The orientation of the main axis of the base plate may thus deviate from the [100] direction by 0 . . . 45°.

Figure 1D:
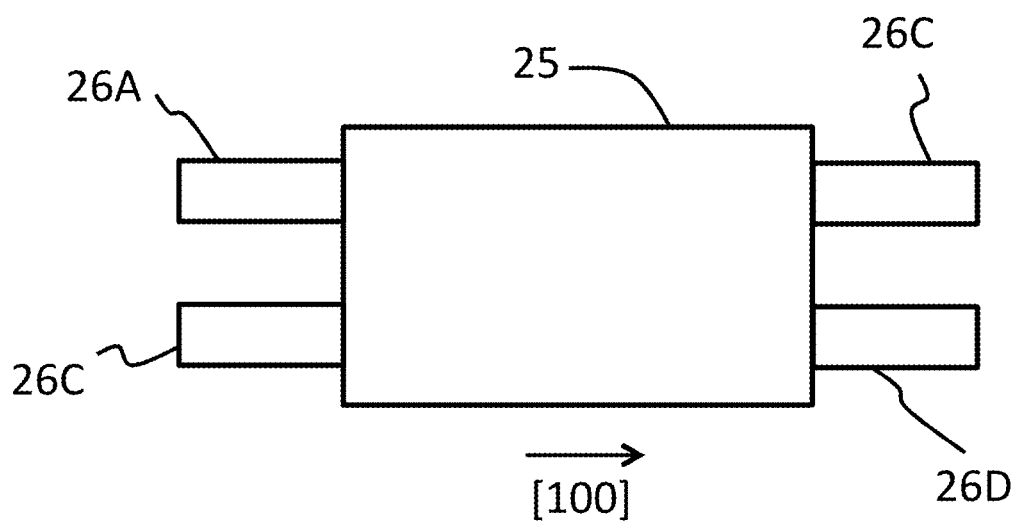

FIG. 1D shows an alternative embodiment of the invention. The resonator comprises a base portion 25, which is again a doped rectangular plate with aspect ratio that allows for ideal anchoring at longitudinal ends thereof. As protrusions, there are provided four flexural beams 26A-D with main axes directed at the [100] direction. In this embodiment, the geometries and doping level of the base portion 25 and flexural beams 26A-D are chosen such that the base portion in WE mode is undercompensated ($TCF_1<0$) and the flexural beams overcompensated ($TCF_1>0$). Again, the compound resonator can be tuned to exhibit an overall $TCF_1$ zero or close to zero at a specific temperature and small $TCF_2$ around that temperature.

Figure 1E:
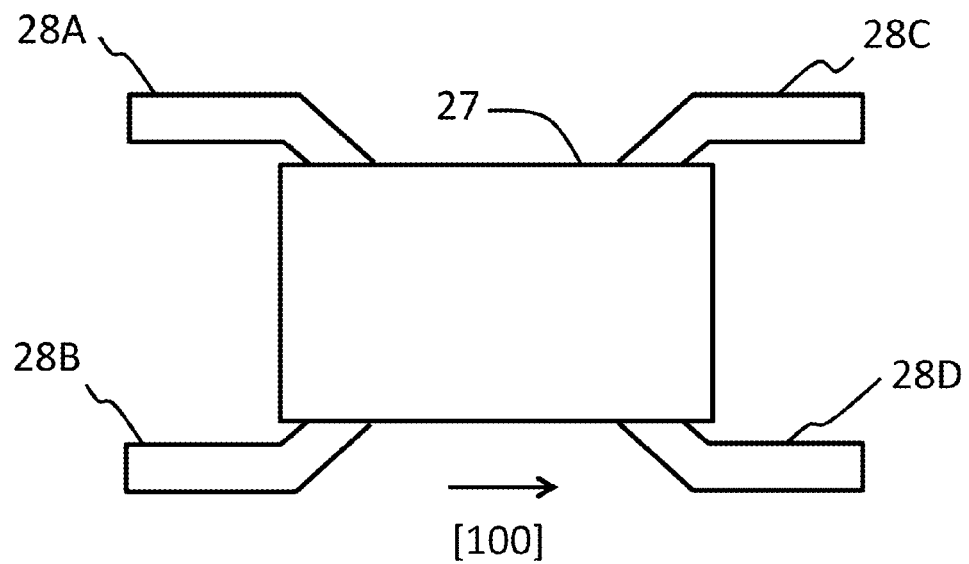
Figure 1F:
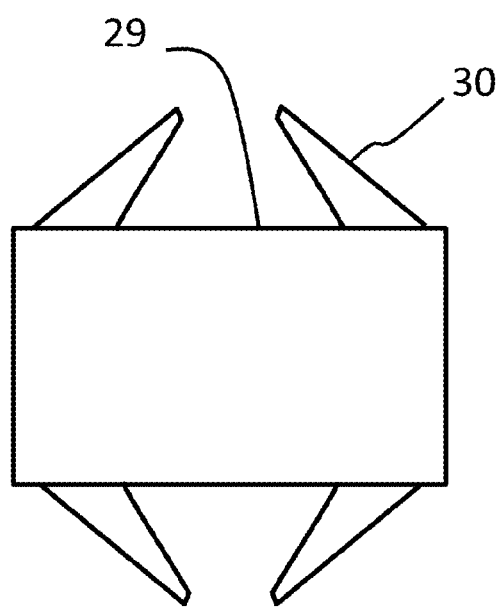
Figure 1G:
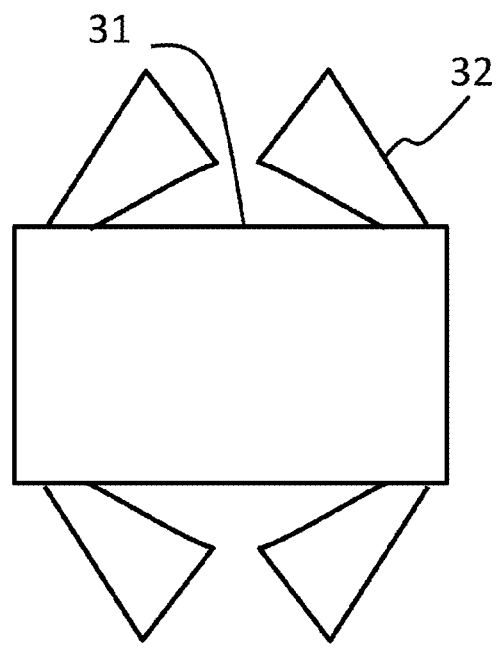

FIG. 1E shows still one embodiment of the invention. The configuration is in principle similar to that of FIG. 1D, but the flexural protrusions 28A-D extend from the longitudinal sides of the base portion 27 (instead of the end sides as shown in FIG. 1D). The protrusions 28A-D comprise shorter intermediate portions at an angle deviating from the [100] direction and longer beams in the [100] direction. As concerns the TCF, main contribution from the protrusions comes from the [100]-directed portions of the beams, whereby the effective compensation is similar to that described with respect to the embodiment of FIG. 1D.

As discussed above with reference to the embodiments of FIGS. 1B and 1C, in the embodiments of FIGS. 1D and 1E too, there exist flexibility with respect to beam angles, numbers, geometries and crystal plane. For example, the beams 26A-D and 28A-D may be arranged at an angle +/−15°, in particular +/−5° with respect to the [100] direction, as long as their linear TCF remains opposite to the TCF of the base portions 25, 27, respectively.

Exemplary suitable doping levels for the resonators according to the invention comprise n-doping concentrations higher than $2*10^{19}$ cm$^{-3}$, for example $2.3 \ldots 20*10^{19}$ cm$^{-3}$. With such concentration, a rectangular plate resonator with an optimal aspect ratio (e.g. 1:1.5) for anchoring in a WE mode has a positive TCF (overcompensated resonator). Beams according to FIG. 1B or 1C with suitable size parameters have a negative TCF in a flexural mode at the same frequency (undercompensated resonators), and therefore contribute in the overall TCF of the compound resonator in the desired way, i.e., decreasing or zeroing TCF. By choosing parameters suitably, not only $TCF_1$ is zeroed but also the $TCF_2$ is close to zero, giving the resonator a wide stable temperature range of operation.

Figure 2A:
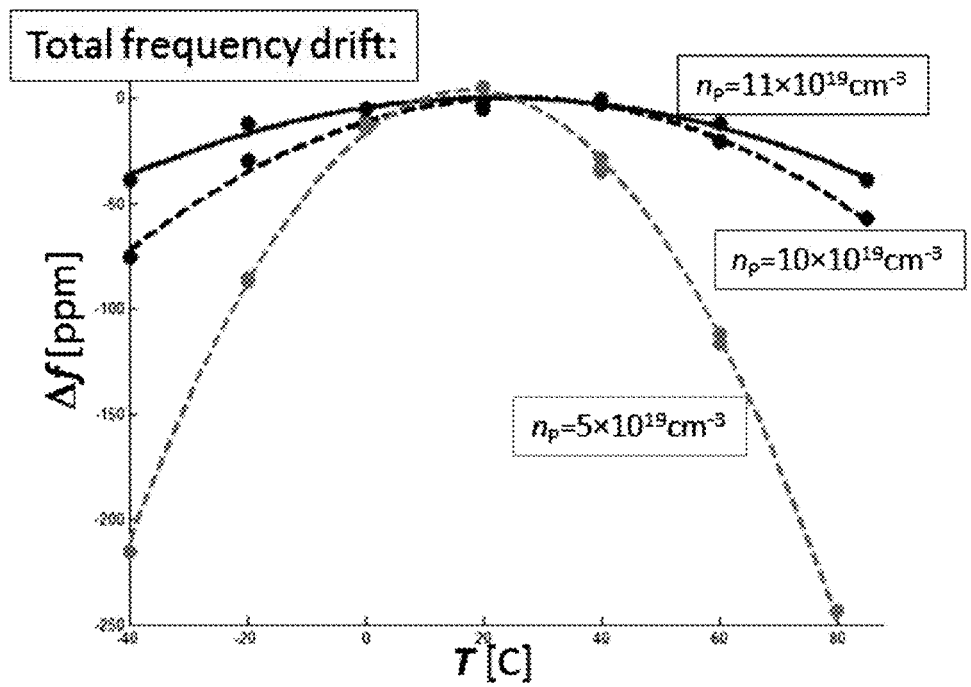
FIG. 2A illustrates a graph of total frequency drift vs. temperature for a SE/WE mode resonator with optimized lateral aspect ratio (W/L) at different doping concentrations.
Figure 2B:
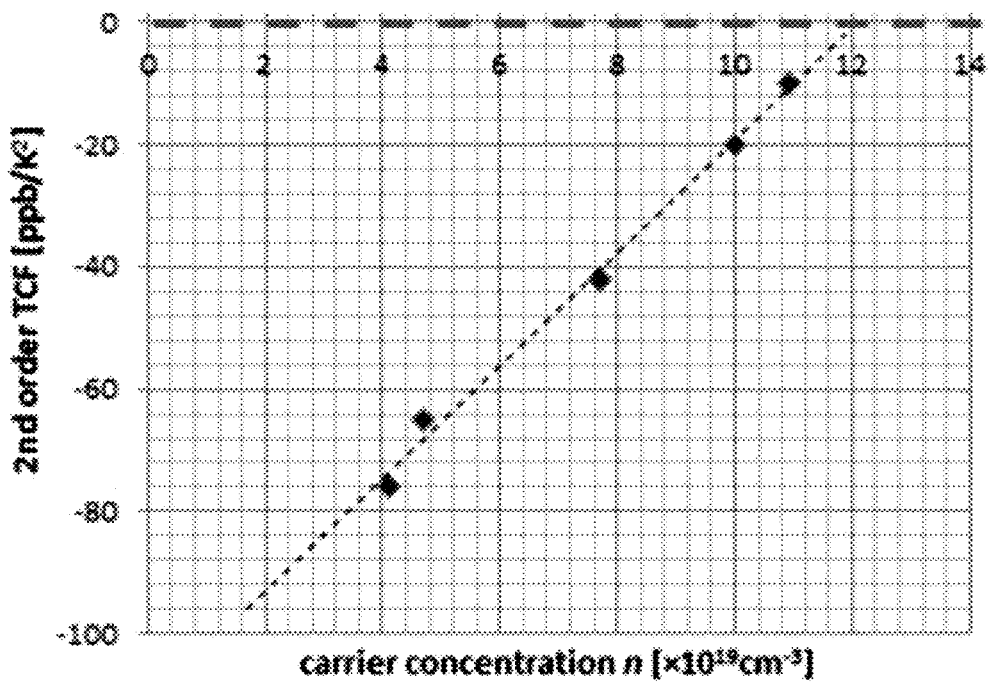
FIG. 2B shows a graph of second order TCF vs. doping concentration for a resonator whose linear TCF is made zero by optimal design.

FIG. 2A illustrates, i.e., total frequency drift Δf vs, temperature T for an optimized SE/WE mode resonator at three different n-doping concentrations. As can be seen the opening curvature of the TCF curve (i.e. $TCF_2$) decreases with increased doping level. In more detail, the evolution of $TCF_2$ is shown in FIG. 2B. Using a linear approximation in this optimal case, it can be estimated that $TCF_2$ is zeroed at approximately $12*10^{19}$ cm$^{-3}$. Taking into account practical factors that cause slow saturation of the $TCF_2$ behavior when the doping concentration is increased, the $TCF_2$ is zeroed somewhere between $12*10^{19}$ and $20*10^{19}$ cm$^{-3}$. Assuming that the second-order TCF grows monotonously when doping gets larger than $11*10^{19}$, and that the linear TCF gets smaller simultaneously, there exist a doping level and a single point (=a definite aspect ratio) on the WE-SE continuous branch, where both $TCF_1$ and $TCF_2$ are zero.

It should be understood that the invention covers a large number of different resonance frequencies, doping concentrations, geometrical configurations (including lateral shape and thickness) of the base plate and protrusions and resonance mode combinations, only some of which are exemplified in the drawings or in the present description. Common to them is that the resonator is a compound resonator comprising at least two different sections with different TCF characteristics that work together to decrease the overall TCF of the resonator. Although it is not possible to cover all possible combinations in detail, some further design principles, guidelines and exemplary parameter values are given below.

Figure 3A:
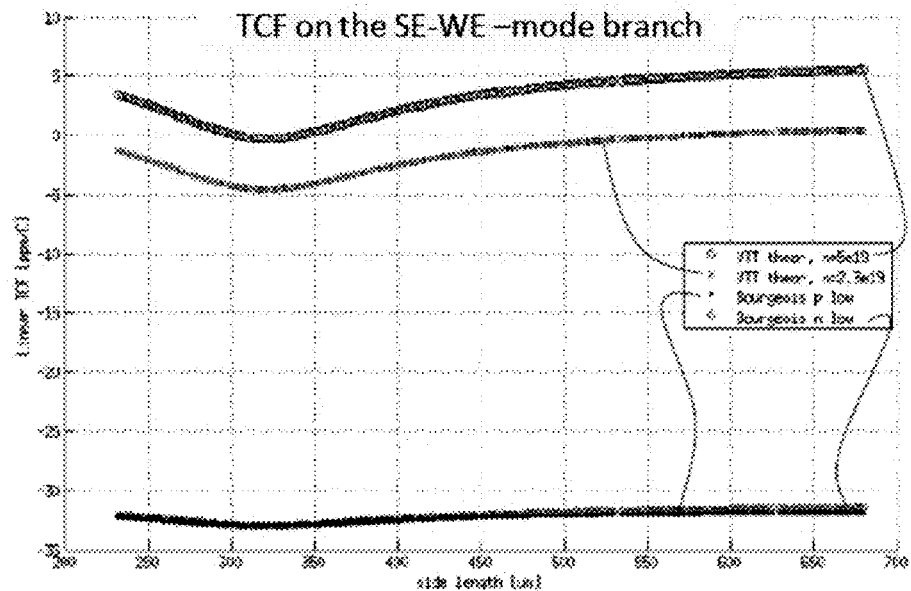
FIG. 3A shows a graph of linear TCF of a SE/WE mode as a function of side length (aspect ratio) of a rectangular plate resonator.
Figure 3B:
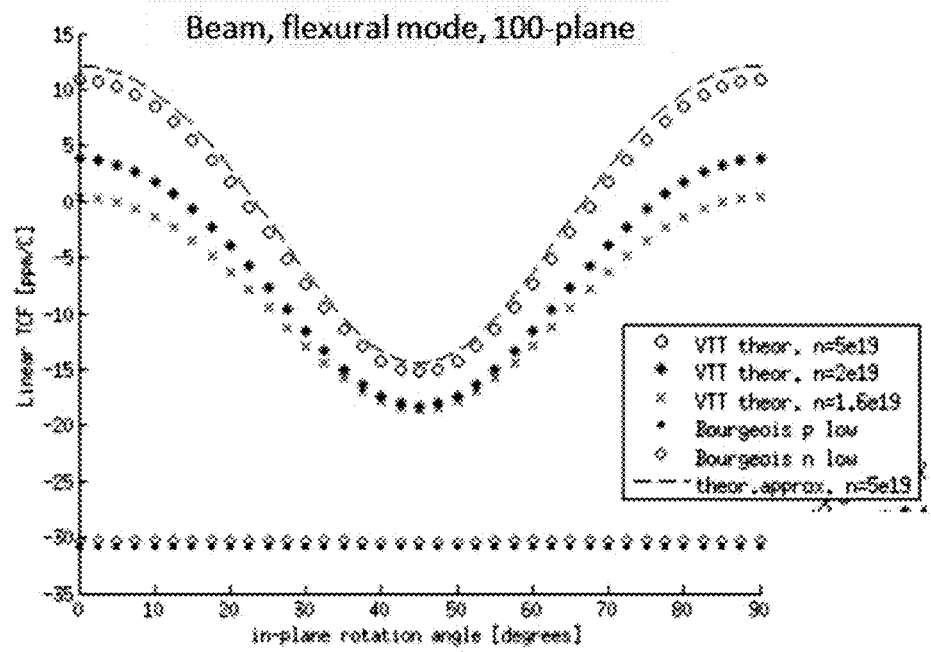
FIG. 3B shows a graph of linear TCF of a flexural mode of a beam resonator as a function of beam angle in relation to [100] crystal direction.

FIG. 3A illustrates the TCF of a WE resonator as a function of its in-plane aspect ratio. Different curves correspond to different n-type doping levels. With n-type doping level in the range of $2.3 \ldots 11*10^{19}$cm$^{-3}$ the linear TCF can be made zero by setting the aspect ratio correctly. Optimal aspect ratio (L:W) ranges from >10:1 (elongated beam) to 1:1 (a square plate). On the other hand, the TCF of a flexural beam resonator depends on its orientation with respect to the silicon crystal lattice as shown in FIG. 3B. Rotation of 0° corresponds to a [100]-direction, and 45° to [110]. If beam-shaped extrusions are added to a WE resonator (symmetrically), it can be expected that the TCF of the compound resonator changes. The TCF of the compound should be some sort of average of the TCFs of the constituents. In particular, the TCF should be reduced if the extensions are aligned with the [110] directions and the TCF should be increased with [100] aligned extrusions, as exemplified above. Of great importance is that in this manner it is possible to produce a desired change in TCF while preserving nodal anchoring.

As one design guideline, it is preferred to avoid a collision of the resonance frequency of the flexural beams and that of the WE mode, i.e. to design the structure such that the base portion and protrusions resonate at different frequencies. This is generally possible, since there appears to be multiple solutions with a desired TCF change. Thus, undesired side-effects of frequency collisions can be avoided or minimized.

Compound LE-flexural Mode Resonator

As an alternative to the WE/LE-flexural modal branch combination discussed above, the invention can be applied for resonator plates operating in the length extensional (LE)/Lamé modal branch.

Figure 4A:
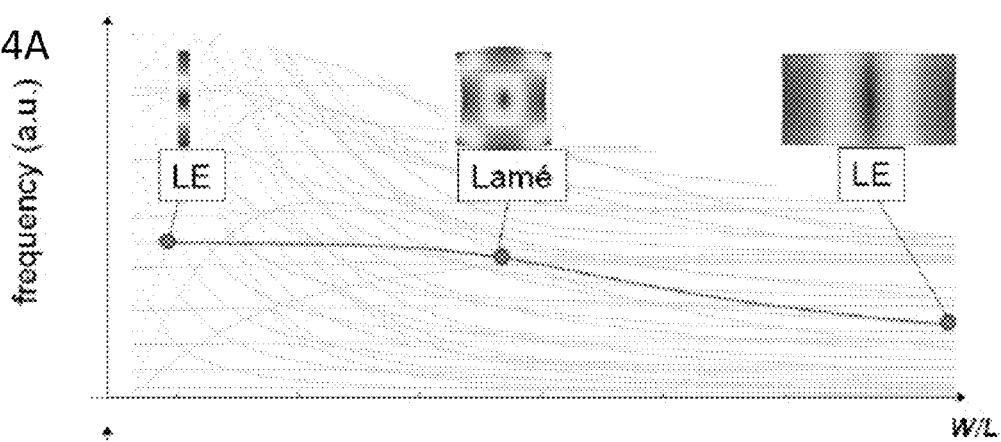
FIG. 4A is a graph of frequency vs. aspect ratio of a LE-Lamé branch resonator.
Figure 4B:
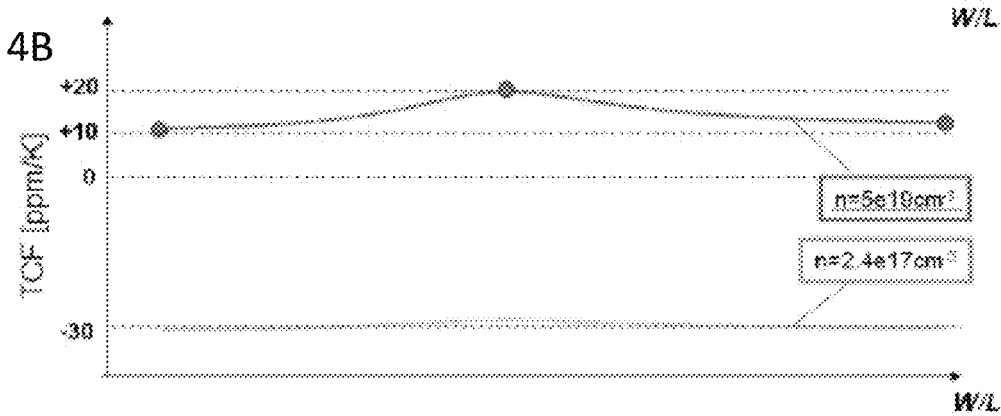
FIG. 4B shows as a graph TCF vs. aspect ratio of a LE-Lamé branch resonator at two different doping levels.

In the same manner as for the WE/LE resonance branch, the TCF of a Lame/length extensional resonator changes as a function of the resonator in-plane aspect ratio. FIGS. 4A and 4B illustrates this effect. If the linear TCF of FIG. 4A gets low enough, a point at which $TCF_1=TCF_2=0$ may be found on the Lame/LE modal branch.

However, there is a gap (in linear TCF space) between the Lame/LE branch and the WE/SE branch. Slightly decreasing the linear TCF of a LE resonator is thus desirable. This can be achieved in the spirit of invention 1, i.e., by adding flexural extrusions in [110] direction to a LE resonator originally in [100] direction. The geometrical configuration in this case is in principle similar to the configurations shown in FIG. 1B or 1C (with different parameter values, however).

Figure 1H:
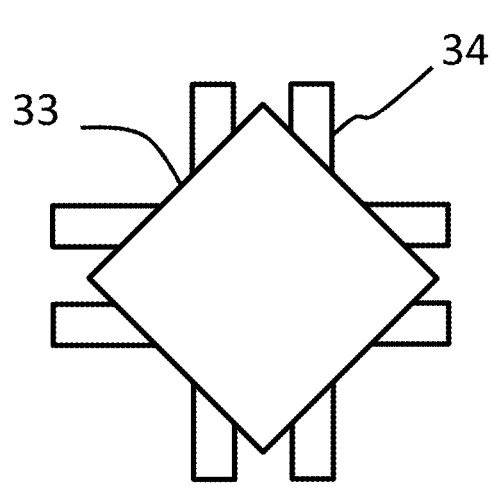
Figure 1I:
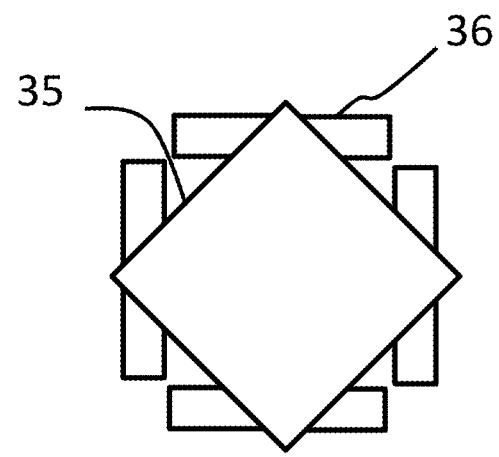

FIGS. 1H and 1I illustrate additional examples of Lamé-mode resonators with square-shaped base plates 33, 35 and a plurality of beams 34, 36, respectively, extending therefrom at 45 degrees angles. Although illustrated in tilted orientation, the [100] crystal direction is preferably along the sides of the main plate. In the configuration of FIG. 1H, the beams 34 are arranged pairwise oriented in the same direction on both sides of the corners of the base plate 33. In the configuration of FIG. 1I, the beams 36 are arranged pairwise and directed in opposite directions on both sides of each corner of the base plate 35. In both configurations, it is possible to maintain nodal points for anchoring at the corners of the base plates by choosing the shapes of the beams and their locations on the sides of the base plates suitably. Like in the previous examples, the angles and beam shape may also deviate from the illustrated ones.

The actuator of the present micromechanical resonator, be it a WE-flexural, LE-flexural, Lame-flexural or of any other type, can be for example a piezoelectric actuator or electrostatic actuator, or any other actuator suitable for exciting BAW resonance modes known per se. According to one embodiment, the actuator comprises a piezoelectric actuator positioned on top of the base portion. Piezoelectric actuators may comprise for example an aluminum nitride (AlN) layer and a molybdenum electrode. The compound resonance mode can be excited with a single actuator, i.e. there is no need for separate actuators for the base portion and the protrusions. Both piezoelectric and electrostatic actuators are known per se and applicable to the present resonator design by a skilled person and not discussed herein in further detail. It has been simulated that flexural protrusions re compatible with these commonly known actuation approaches.

Numerical Verification

The principle of the invention has been verified by extensive simulations numerically. The verification method is described below.

WE Mode and 110-directed Flexural Extensions

Figure 5:
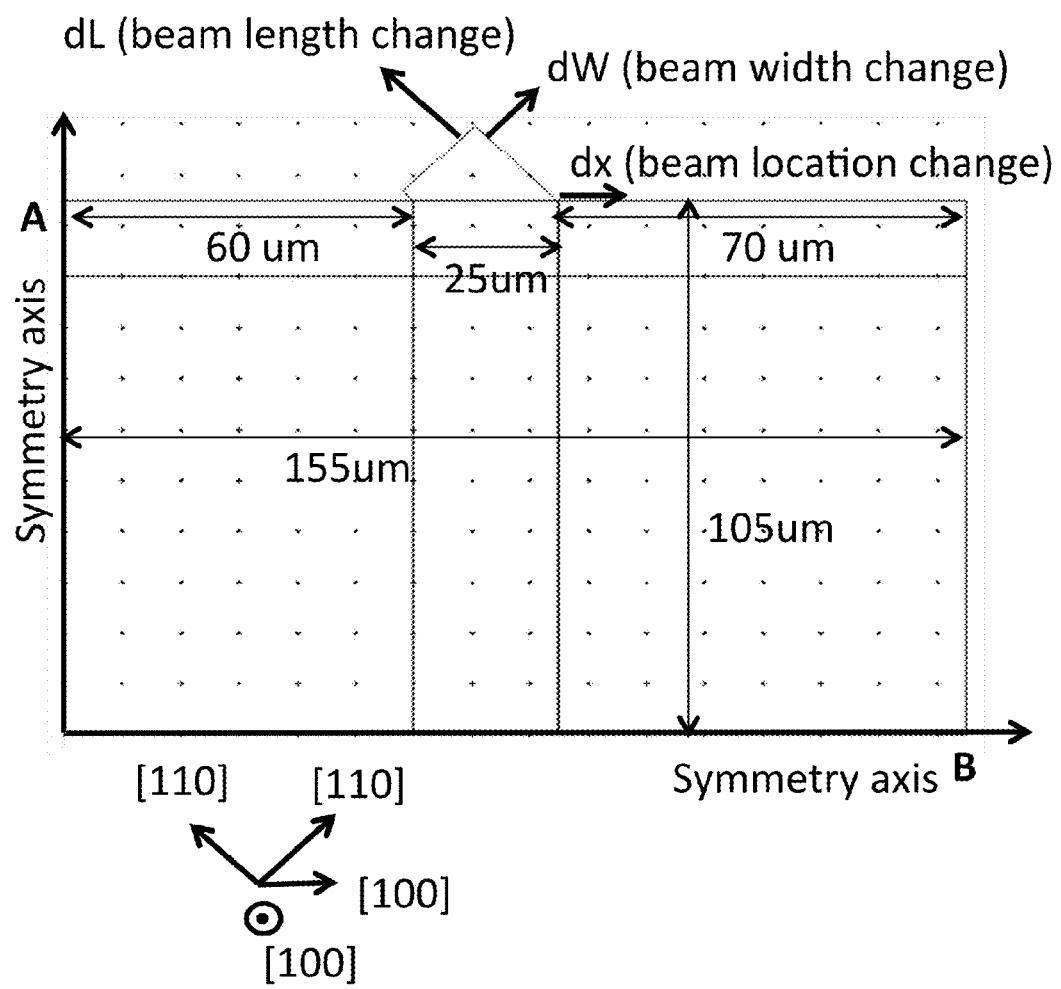
FIG. 5 shows a quarter-element of a resonator according to one embodiment of the invention used a simulation model.

A parametric model of a WE resonator with a [110]-directed extrusion was constructed. The model is shown in FIG. 5. Northeast corner of the resonator according to FIG. 1B was included in the model, and symmetry boundary conditions at the x/y axes were applied.

The WE resonator dimensions were kept constant (210× 315 μm for the rectangular WE resonator), and the extrusion beam dimensions were varied:

beam width dW was varied from 10 to 50 micrometers with 10 μm steps.
  beam location dx was varied on the WE resonator top edge from corner to corner with 5 μm steps.
  beam length dL was varied from 5 μm to 80 μm with 5 μm steps.

Figure 6A:
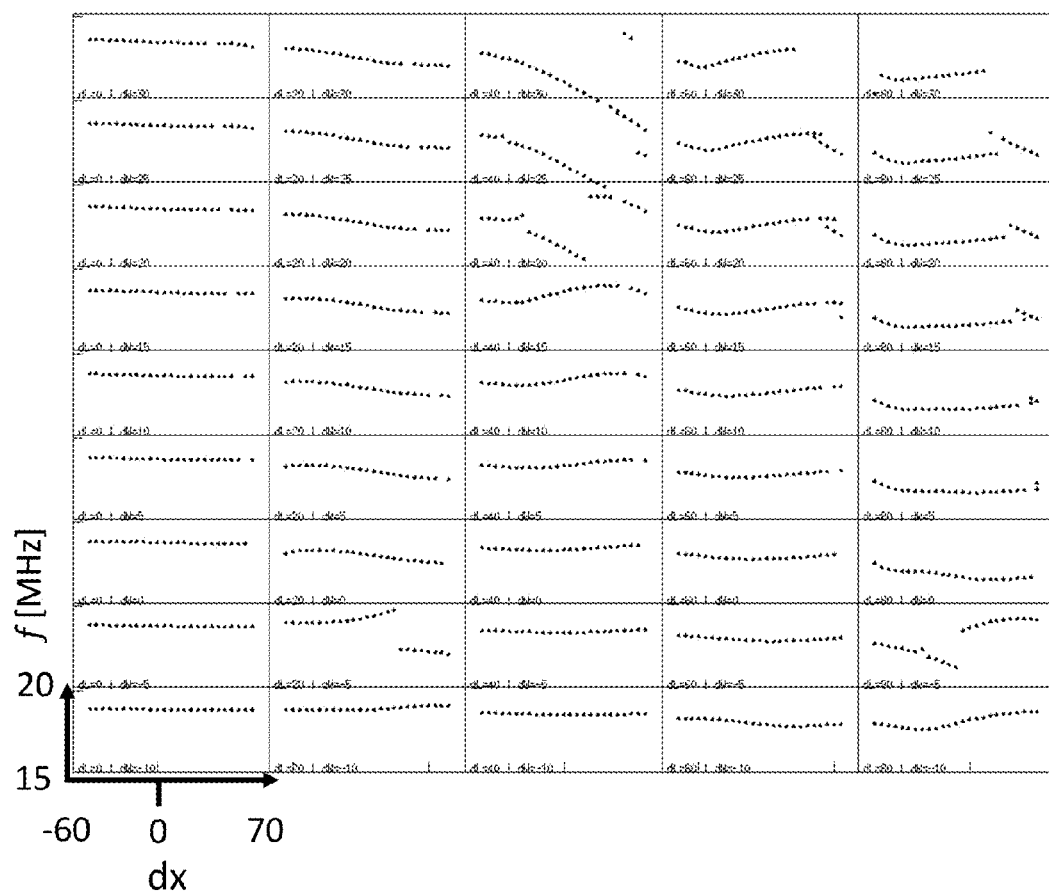
FIGS. 6A-6E illustrate displacement of nodal points and change of TCF with respect to pure WE resonator TCF of a compound WE-flexural mode resonator according to FIG. 1B for a plurality of simulated geometries.

Modal analysis was performed on all combinations of the parameters. The frequencies of the WE modes are shown in the plot matrix of FIG. 6A. The subplots contain all variations of parameters dW and dL. The values of dW run from dW=30 at the topmost row to dW=−10 in to lowermost row with steps of 5 and the values of dL run from dL=0 at the leftmost column to dL=80 at the rightmost column with steps of 20 in all FIGS. 6A-6G. The axes are identical for all subplots, and they are denoted only in the southwest subplot. The horizontal axis represents the parameter dx, and the modal frequencies are shown on the vertical axis.

The TCF for a non-perturbed WE mode is $TCF_{WE}=+4.3$ ppm/C (calculated for doping of $5*10^{19}$ cm$^{-3}$). The shade of the plot of FIG. 6B illustrates the change of the TCF from $TCF_{WE}$, i.e., how the beam extrusion modifies the TCF of the compound resonator.

Figure 6B:
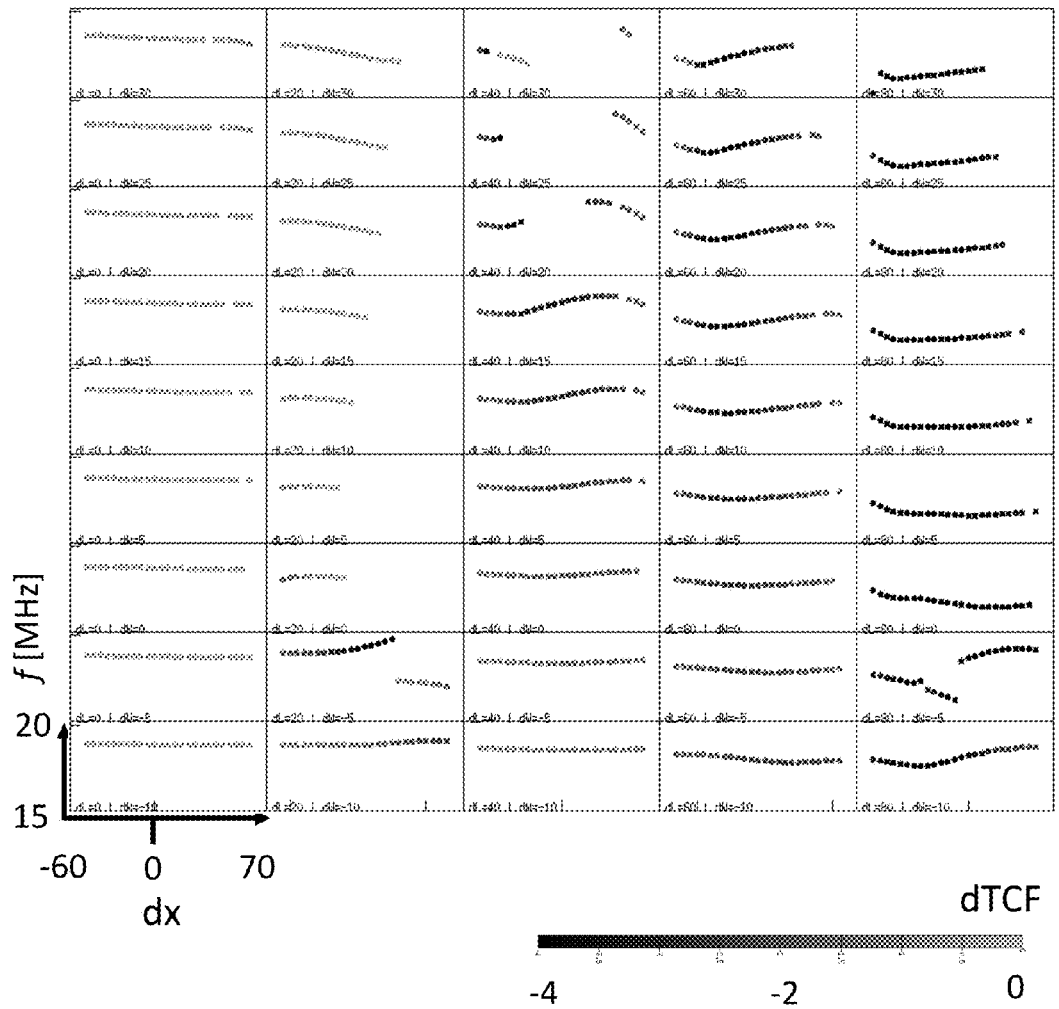
Figure 6C:
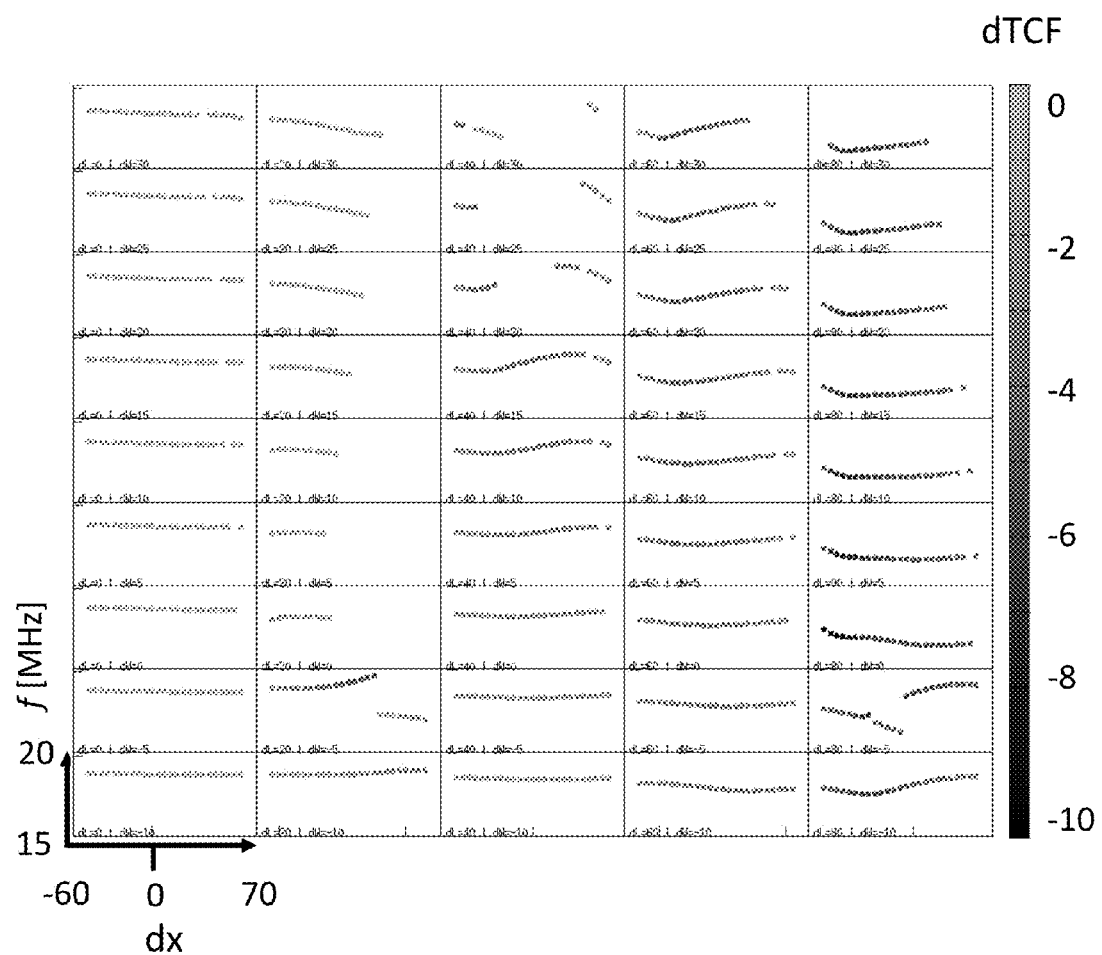

To illustrate the full range of TCF changes, the plot of FIG. 6B is repeated in FIG. 6C, now with the shade coding ranging from −10 to 0 (instead of −4 to 0).

Next we define a "nodalFOM", i.e. a figure of merit which quantifies how good a nodal point is formed at location B (see FIG. 5):

$$nodalFOM = dx(B)/dy(A)$$

which is the x-directed displacement at point B normalized by the y-directed displacement at point A. For a perfect nodal point nodalFOM should be zero.

Figure 6D:
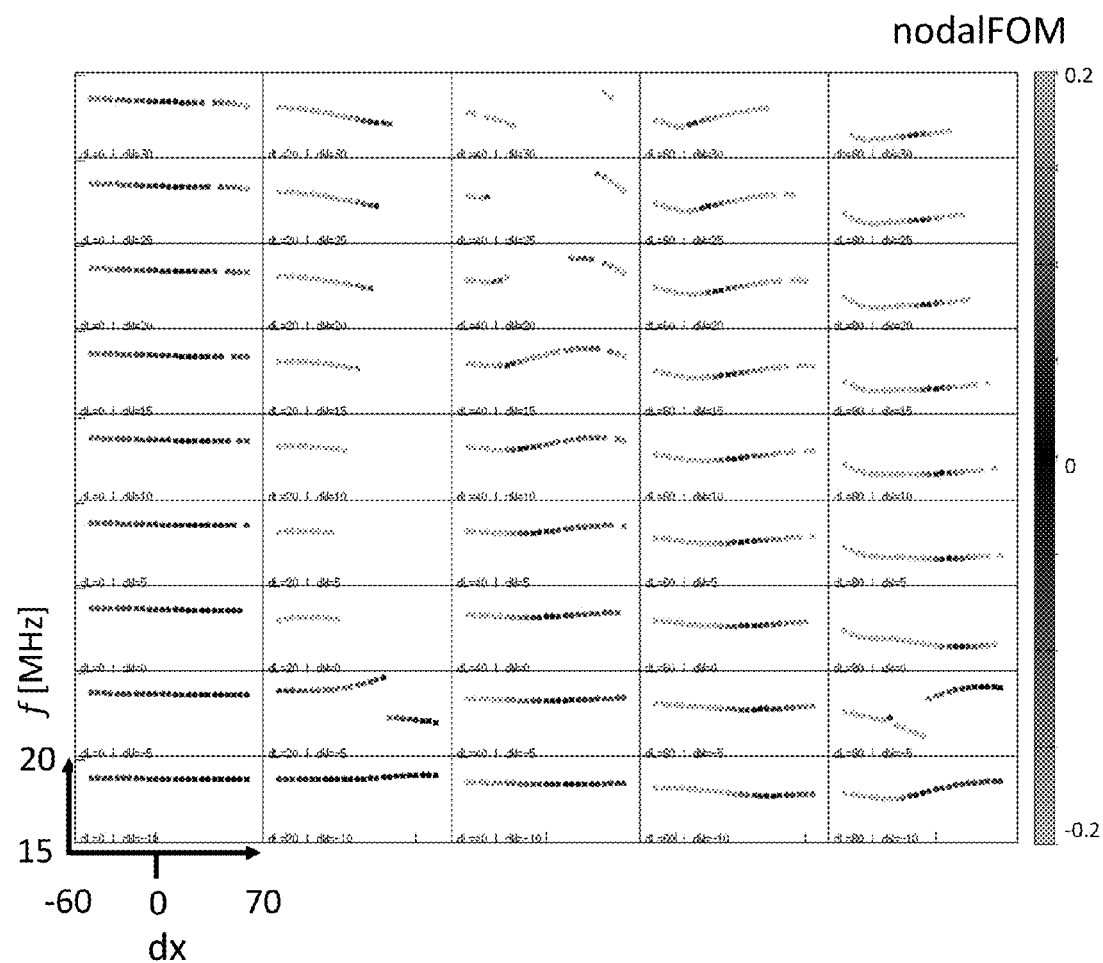
Figure 6E:
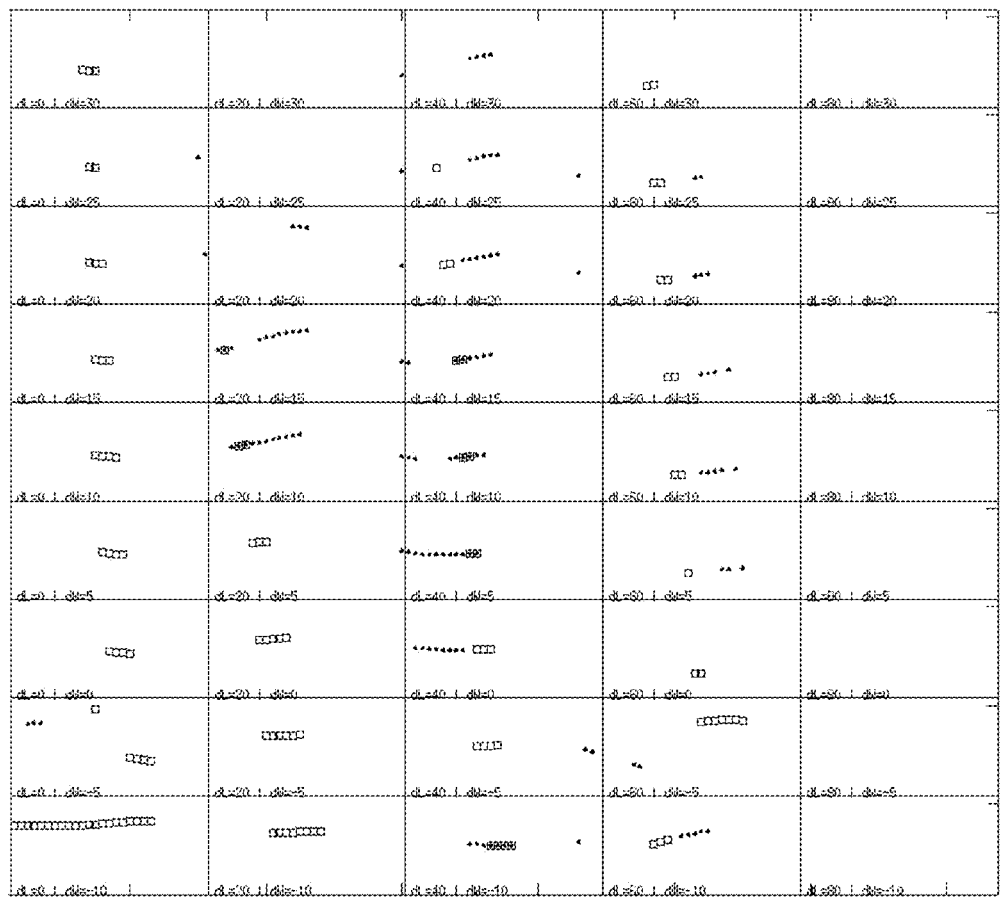

FIG. 6D shows with shade coding how nodalFOM is changed for different combinations of dx, dW and dL, respectively.

It is evident from the plots of FIGS. 6A-6D that there exist many combinations of dx, dW and dL, for which a desired change of TCF in the range of −4 . . . 0 can be found, while at the same time achieving a near-zero value for nodalFOM. This is exemplified in the three plots below, where a small nodalFOM is illustrated with open squares and a desired TCF change is shown with dots (first plot: desired TCF change is approx. −3 ppm/C, second: approx. −2 ppm/C, third: approx. −1 ppm/C). Optimal designs are found at points (in dL, dW, dx parameter space) where a dot is surrounded by a square. It is obvious that new optimal designs can be found by denser discretization of the dL, dW, dx parameter space (for example, in the above described simulation the discretization of dL was rather coarse, 20 μm).

Figure 6F:
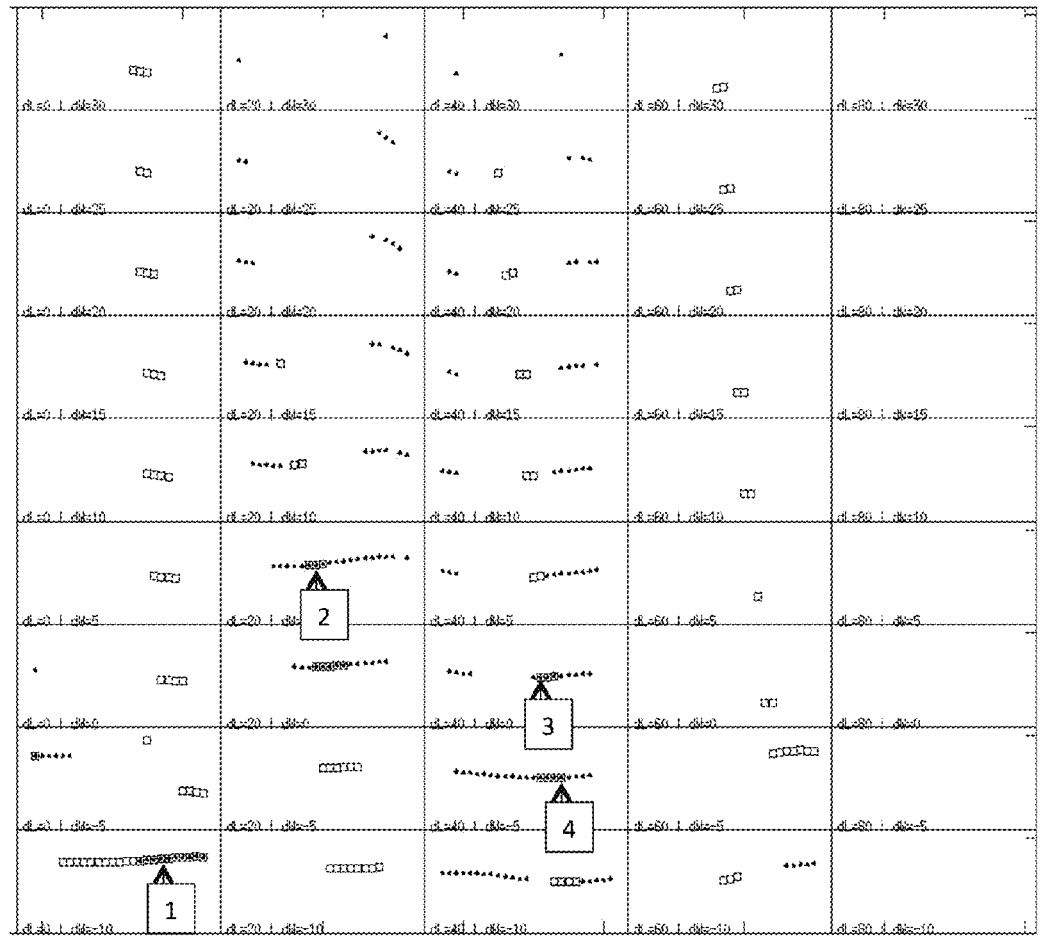
Figure 6G:
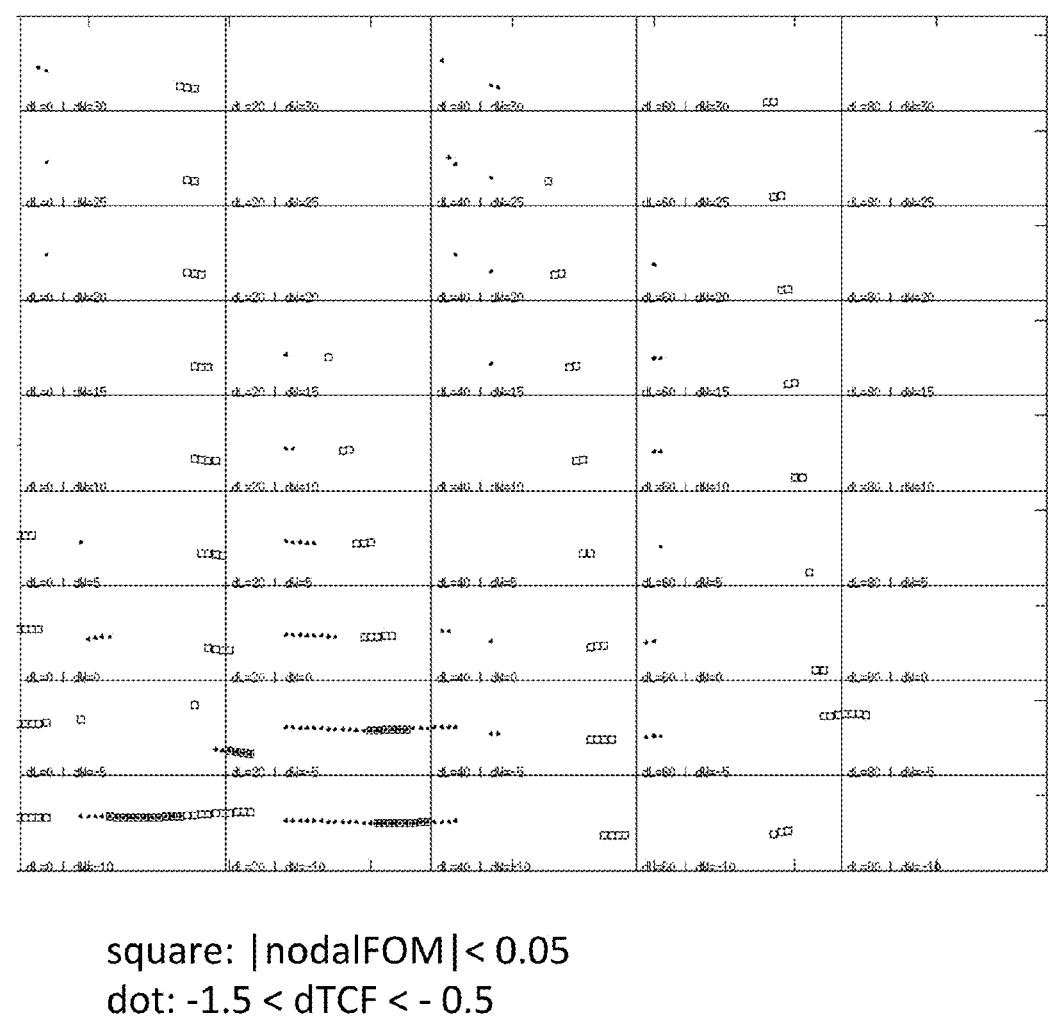
Figure 6H:
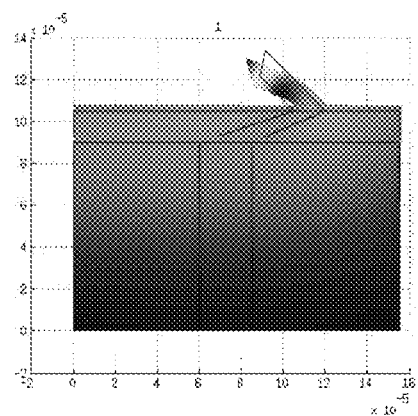
Figure 6I:
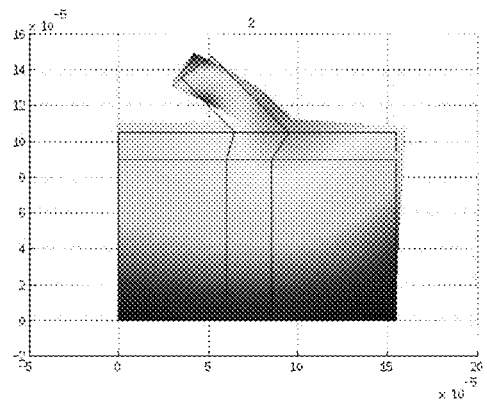
Figure 6J:
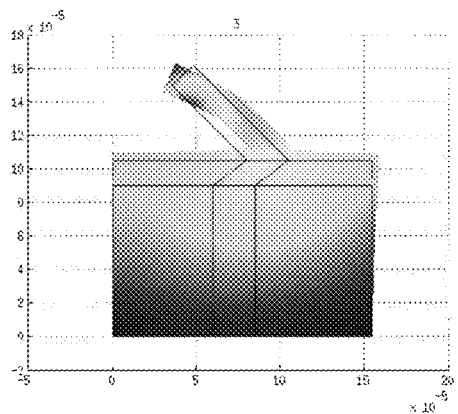
Figure 6K:
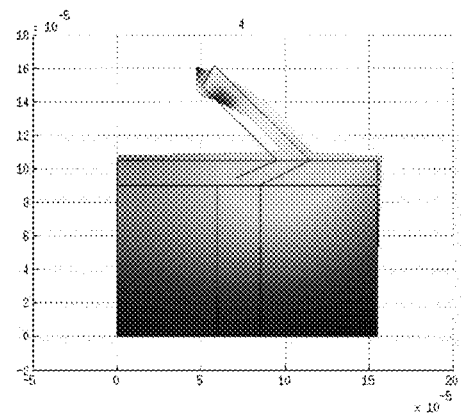

As an example, geometries and mode shapes labeled as 1-4 in FIG. 6F are illustrated in FIGS. 6H-6K, respectively.

LE Mode and 110-directed Flexural Extensions

Figure 7A:
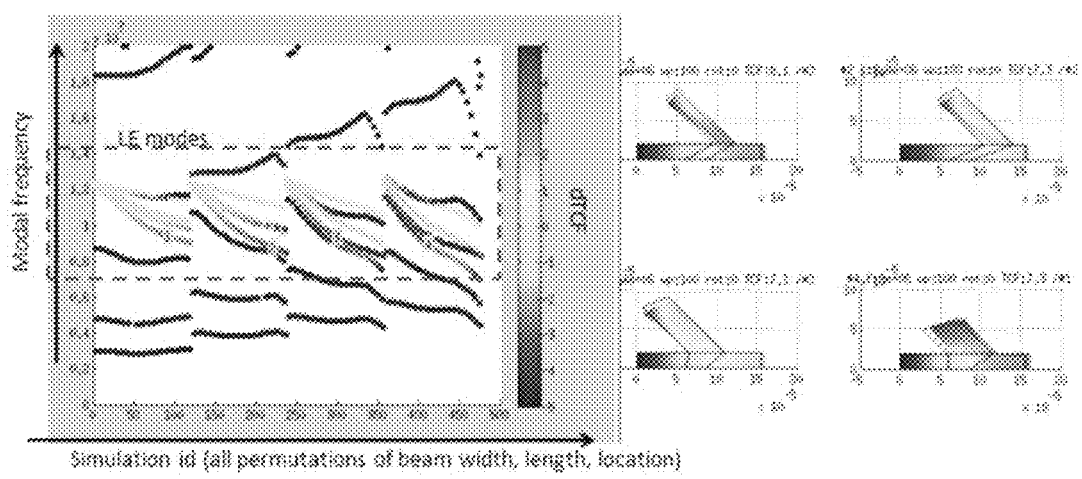
FIG. 7A shows simulation results for LE-flexural mode compound resonator geometries to show that optimal nodal anchoring and efficient temperature compensation are possible simultaneously.

Similar parametric analyses were performed for a modified LE resonator geometry. FIG. 7A shows that TCF changes (dTCF) in the range of 0 . . . −5 appear possible.

Figure 8A:
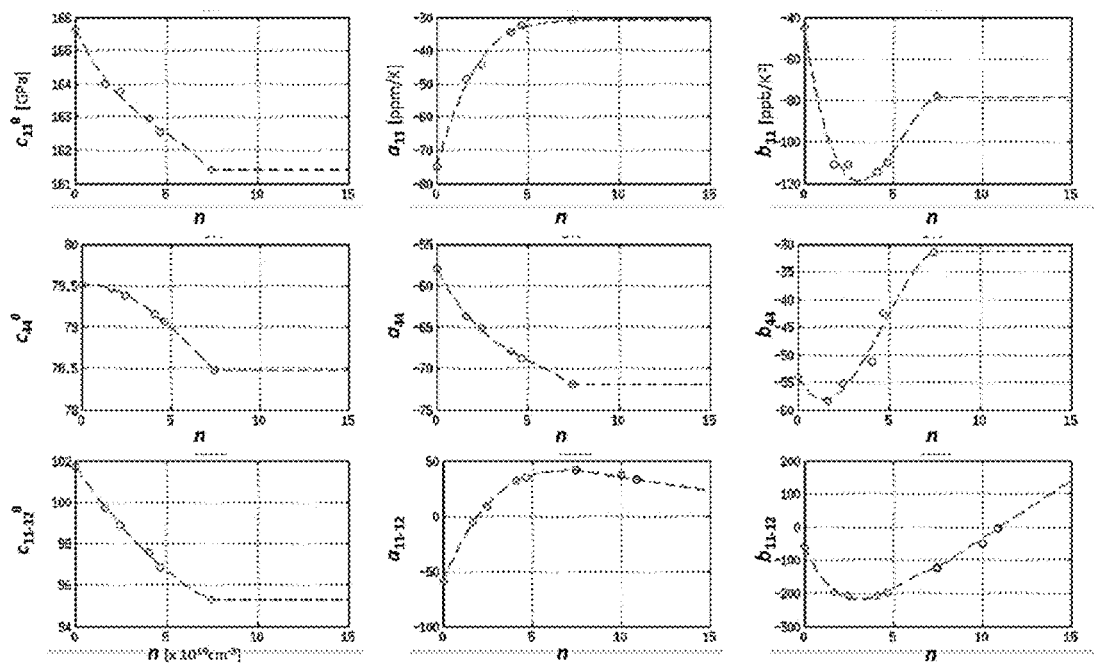
FIGS. 8A and 8B show graphs of temperature coefficients of the elastic parameters $c_{ij}$ of silicon as a function of doping concentration n.
Figure 8B:
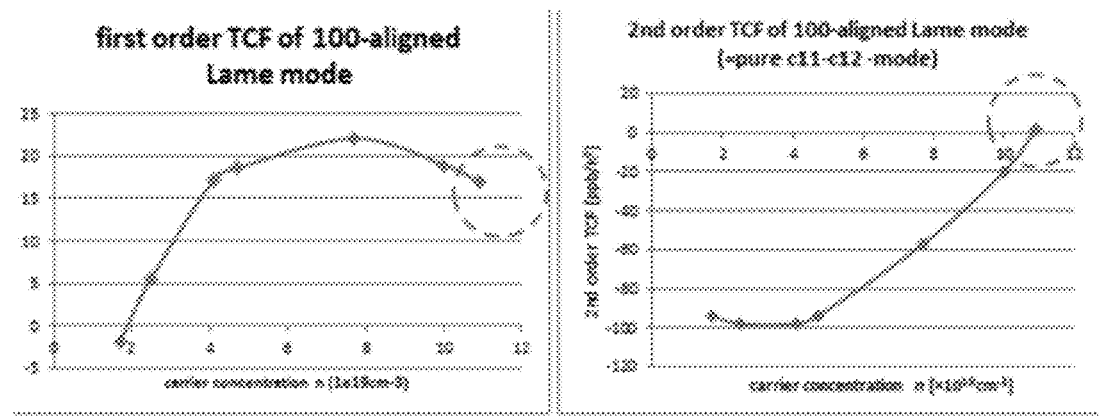
Figure 8C:
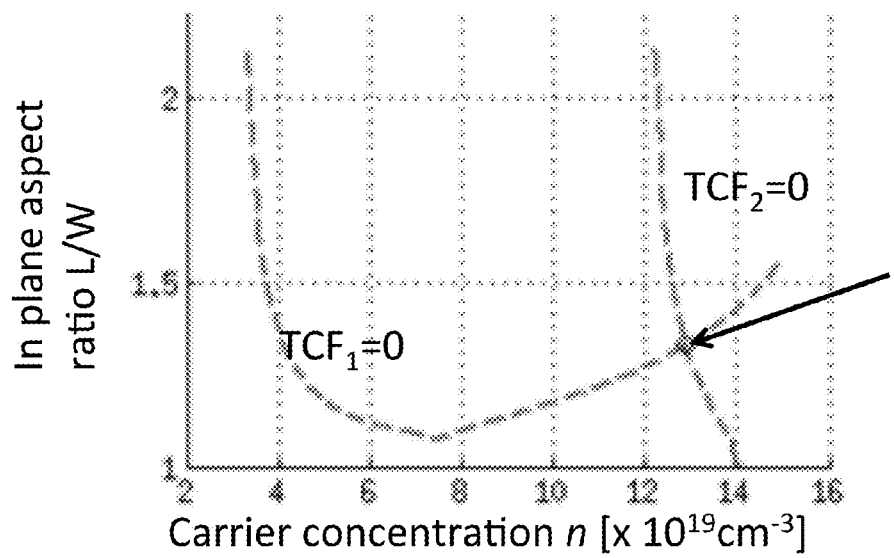
FIG. 8C shows $TCF_1=0$ and $TCF_2=0$ curves of a WE mode resonator as a function of doping concentration and in-plane aspect ratio of the base portion of the resonator.

Additional Considerations on Shape of Rectangular WE Mode Resonator with Zero TCF To illustrate that simultaneous first and second order TCF zeroing and nodal anchoring is not possible for a WE-mode design (in accordance with FIG. 1A) without protrusions according to the invention, FIGS. 8A-8C and the following discussion are presented.

FIG. 8A shows temperature coefficients of the elastic parameters $c_{ij}$ as a function of carrier concentration n. The first, second and third column represent the constant terms $c^0_{ij}$, linear coefficients $a_{ij}$, and second-order coefficients $b_{ij}$ at T=25° C., respectively. $c^0_{11-12}$, $a_{11-12}$ and $b_{11-12}$ are shorthands for the coefficients of $c_{11}-c_{12}$. The dependent coefficient $a_{12}$ is readily evaluated as $a_{12}=(a_{11}c^0_{11}-a_{11-12}c^0_{11-12})/c^0_{12}$, and a similar equation holds for $b_{12}$. Data points at carrier concentration below $7.5*10^{19}$ cm$^{-3}$ represent data from literature (Jaakkola et al, "*Determination of doping and temperature dependent elastic constants of degenerately doped silicon from MEMS resonators,*" IEEE Transactions on Ultrasonics, Ferroelectrics, and Frequency Control. IEEE. Vol. 61 (2014) No: 7, 1063-1074). Data points for $1^{st}$ and $2^{nd}$ order coefficients $a_{11-12}$ and $b_{11-12}$ at carrier concentration $10*10^{19}$ cm$^{-3}$ and $11*10^{19}$ cm$^{-3}$ are shown with circles as well; these data points are based on recent measurement results of the applicant, shown in FIG. 8B, and importantly show the property of values of $b_{11-12}$ following the positive slope that starts from a dopant concentration below $5*10^{19}$ cm$^{-3}$. In calculations for producing results of FIG. 8C the interpolated/extrapolated values represented by the dashed curves of FIG. 8A have been used.

The fit at carrier concentration $0<n<7.5*10^{19}$ cm$^{-3}$ is based on a third order polynomial fit to the data points at carrier concentration $0<n<7.5*10^{19}$ cm$^{-3}$ for all nine terms shown in the plot. The fit of $a_{11-12}$ and $b_{11-12}$ at carrier concentration $n>=7.5*10^{19}$ cm$^{-3}$ is based on a linear fit to the three data points available on this range. For other terms except $a_{11-12}$ and $b_{11-12}$ the values are assumed to stay at the same level as the experimental data at $n=7.5*10^{19}$ cm$^{-3}$. Hence, for these cases, the dashed line is horizontal for $n>7.5*10^{19}$ cm$^{-3}$. Reason for this choice was that no experimental data exists for other than terms $a_{11-12}$ and $b_{11-12}$ at carrier concentrations above $7.5*10^{19}$ cm$^{-3}$. As a result, the results of FIG. 8C are not expected to be quantitatively perfectly accurate, but they demonstrate the existence of optimal configurations where $TCF_1$ and $TCF_2$ can be zeroed simultaneously. Also, as the main terms contributing to the temperature coefficients of the resonance modes discussed in this document are $a_{11-12}$ and $b_{11-12}$ it is justified to assume that predictions of FIG. 8C hold fairly well.

FIG. 8B shows the experimental data measured for a Lamé-mode resonator, which is aligned with the [100] crystalline direction so that its modal frequency is dependent solely on the elastic parameter difference term $c_{11-12}$. Data points for doping concentration $n<7.5*10^{19}$ cm$^{-3}$ are from literature (Jaakkola et al, "Determination of doping and temperature dependent elastic constants of degenerately doped silicon from MEMS resonators," IEEE Transactions on Ultrasonics, Ferroelectrics, and Frequency Control, IEEE. Vol. 61 (2014) No: 7, 1063-1074), but the two data points with the highest doping concentration have not previously been published. Based on the experimental data, it can be expected that the $2^{nd}$ order TCF of the [100]-aligned Lame mode resonator attains even more positive values at higher dopant levels. This has indeed been assumed in FIG. 8A, where the behavior of the $b_{11-12}$ term has been extrapolated.

It is found in FIG. 8C that the $TCF_1=0$ and $TCF_2=0$ curves intersect at about $n=13*10^{19}$ cm$^{-3}$ and aspect ratio L/W of 1.3. At this optimal point, the total frequency deviation $\Delta f_{total}$ reaches zero. However, it can be shown that for such resonator, there exist no nodal points at the perimeter of the plate, whereby low-loss anchoring is not possible. As concerns nodal anchoring, preferred aspect ratios (W:L) would be 1:1.5, 1:2.7, 1:4.3, 1:5.5, 1:7.0, 1:8.7 (with 5% accuracy) which, however, do not zero the TCFs. This justifies that the present design with additional protrusions at the perimeter of the plate is very beneficial.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A microelectromechanical resonator device comprising;
   a support structure,
   an actuator,
   a doped semiconductor resonator, wherein the resonator has a base portion and at least one protrusion extending from the base portion, and wherein the resonator is excitable by said actuator into a compound resonance mode having temperature coefficient of frequency (TCF) characteristics which are contributed by both the base portion and the at least one protrusion, and
   at least one anchor suspending the resonator to the support structure.

2. The resonator device according to claim 1, wherein the compound resonance mode essentially comprises a first resonance mode in said base portion, the first resonance mode having first TCF characteristics, and a second resonance mode different from the first resonance mode in said at least one protrusion, the second resonance mode having second TCF characteristics, the second TCF characteristics being different from the first TCF characteristics.

3. The resonator device according to claim 1, wherein the compound resonance mode essentially comprises a bulk acoustic wave (BAW) resonance mode in said main portion and a flexural resonance mode in the at least one protrusion.

4. The resonator device according to claim 1, wherein TCFs of the base portion and the at least one protrusion have opposite signs within at least one temperature region.

5. The resonator device according to claim 1, wherein the base portion comprises a rectangular plate having an aspect ratio higher than one.

6. The resonator device according to claim 1, wherein there are at least four protrusions extending from the base portion of the resonator.

7. The resonator device according to claim 1, wherein the at least one protrusion comprises a flexural beam having a longitudinal axis not coinciding with a main axis of the base portion.

8. The resonator device according to claim 1, wherein the protrusions comprise a plurality of flexural beams protruding from the base portion at different lateral directions, the angle of each beam with respect to a main axis of the base portion being 20-70°.

9. The resonator device according to claim 1, wherein the protrusions comprise a plurality of flexural beams each protruding from the base portion in the lateral direction of one of the main axes of the base portion.

10. The resonator device according to claim 1, further comprising a plurality of said protrusions symmetrically arranged around the main portion.

11. The resonator device according to claim 1, further comprising two or more of said anchor elements extending between the support structure and two or more nodal points of the base portion in said compound resonance mode.

12. The resonator device according to claim 1, wherein
the base portion of the resonator element is a rectangular plate having an aspect ratio greater than 1, and with one main axis directed along a crystal direction of the semiconductor material of the resonator within the limits of +/−5°, and
the protrusions comprise four or more flexural beams symmetrically arranged at the perimeter of the base portion and being directed essentially along the crystal direction of the semiconductor material within the limits of +/−5°.

13. The resonator device according to claim 1, wherein the compound resonance mode essentially comprises a width-extensional (WE) bulk acoustic wave (BAW) mode in said base portion and a flexural mode in said at least one protrusion.

14. The resonator device according to claim 1, wherein the compound resonance mode essentially comprises a length-extensional (LE) bulk acoustic wave (BAW) mode in said base portion and a flexural mode in said at least one protrusion.

15. The resonator device according to claim 1, wherein the compound resonance mode essentially comprises a Lamé bulk acoustic wave (BAW) mode in said base portion and a flexural mode in said at least one protrusion.

16. The resonator device according to claim 1, wherein the compound resonance mode, the at least one protrusion is arranged to resonate at a different frequency than the base portion.

17. The resonator device according to claim 1, wherein the resonator further comprises a monolithic silicon matrix doped with an n-type doping agent to an average doping concentration of at least $2.3*10^{19}$ cm$^{-3}$ of the doping concentration being essentially homogeneous over the resonator.

18. The resonator device according to claim 1, wherein the overall TCF of the resonator is within 10 ppm over a temperature range of at least 50° C.

* * * * *